United States Patent
Luo et al.

(10) Patent No.: US 9,666,736 B2
(45) Date of Patent: May 30, 2017

(54) PHOTODETECTOR ARRANGEMENT

(71) Applicant: Agency for Science, Technology and Research, Singapore (SG)

(72) Inventors: Xianshu Luo, Singapore (SG); Junfeng Song, Singapore (SG); Guo-Qiang Patrick Lo, Singapore (SG)

(73) Assignee: Agency for Science, Technology and Research, Singapore (SG)

(*) Notice: Subject to any disclaimer, the term of this patent is extended or adjusted under 35 U.S.C. 154(b) by 63 days.

(21) Appl. No.: 14/761,382

(22) PCT Filed: Jan. 27, 2014

(86) PCT No.: PCT/SG2014/000034
§ 371 (c)(1),
(2) Date: Jul. 16, 2015

(87) PCT Pub. No.: WO2014/120091
PCT Pub. Date: Aug. 7, 2014

(65) Prior Publication Data
US 2015/0372164 A1    Dec. 24, 2015

(30) Foreign Application Priority Data

Jan. 30, 2013  (SG) .................................. 201300749

(51) Int. Cl.
| H01L 31/0232 | (2014.01) |
| H01L 31/109 | (2006.01) |
| H01L 31/18 | (2006.01) |
| H01L 27/144 | (2006.01) |
| H01L 31/028 | (2006.01) |
| G02B 6/12 | (2006.01) |
| G02B 6/28 | (2006.01) |

(52) U.S. Cl.
CPC .... *H01L 31/02327* (2013.01); *H01L 27/1446* (2013.01); *H01L 31/028* (2013.01); *H01L 31/109* (2013.01); *H01L 31/1808* (2013.01); *G02B 6/12004* (2013.01); *G02B 6/2861* (2013.01); *Y02E 10/50* (2013.01)

(58) Field of Classification Search
CPC ................................................. H01L 31/02327
USPC ........................................................ 257/432
See application file for complete search history.

(56) References Cited

U.S. PATENT DOCUMENTS

2011/0305416 A1    12/2011  Mekia et al.

FOREIGN PATENT DOCUMENTS

| FR | 2104946 | 4/1972 |
| FR | 2104946 A2 | 4/1972 |

(Continued)

OTHER PUBLICATIONS

International Preliminary Report on Patentability for International Application No. PCT/SG2014/000034 dated Aug. 13, 2015, pp. 1-10.

(Continued)

*Primary Examiner* — Anthony Ho
(74) *Attorney, Agent, or Firm* — Winstead, P.C.

(57) ABSTRACT

According to embodiments of the present invention, a photodetector arrangement is provided. The photodetector arrangement includes a plurality of germanium-based photodetectors, each germanium-based photodetector configured to receive an optical signal and to generate an electrical signal in response to the received optical signal, and an electrode arrangement arranged to conduct the electrical signals.

19 Claims, 9 Drawing Sheets

(56) References Cited

FOREIGN PATENT DOCUMENTS

JP   2013083680 A   5/2013
WO   03038492 A2   5/2003

OTHER PUBLICATIONS

Liow et al., "Silicon Modulators and Germanium Photodetectors on SOI: Monolithic Integration, Compatibility, and Performance Optimization," IEEE J. Select. Top. Quantum Electron., vol. 16, No. 1, Jan./Feb. 2010, pp. 307-315.
Cheng P. Wen, "Coplanar Waveguide: A Surface Strip Transmission Line Suitable for Nonreciprocal Gyromagnetic Device Applications," IEEE Trans. Microw. Theory Tech., vol. MTT-17, No. 12, Dec. 1969, pp. 1087-1090.
Hasnain et al., "Dispersion of Picosecond Pulses in Coplanar Transmission Lines," IEEE Trans. Microw. Theory Tech., vol. MTT-34, No. 6, Jun. 1986, pp. 738-741.
Lin et al., "High-Power High-Speed Photodetectors—Design, Analysis, and Experimental Demonstration," IEEE Trans. Microw. Theory Tech., vol. 45, No. 8, Aug. 1997, pp. 1320-1331.
Goldsmith et al., "Principles and Performance of Traveling-Wave Photodetector Arrays", IEEE Trans. Microwave., vol. 45, No. 8, Aug. 1997, pp. 1342-1350.
Ramaswamy et al., "High Power Silicon-Germanium Photodiodes for Microwave Photonic Applications," IEEE Trans. Microwave., vol. 58, No. 11, Nov. 2010, pp. 3336-3343.
Written Opinion of the International Searching Authority for International Application No. PCT/SG2014/000034 dated Mar. 31, 2014, pp. 1-8.

PHOTODETECTOR ARRANGEMENT

CROSS-REFERENCE TO RELATED APPLICATION

This application claims the benefit of priority of Singapore patent application No. 201300749-7, filed 30 Jan. 2013, the content of it being hereby incorporated by reference in its entirety for all purposes.

TECHNICAL FIELD

Various embodiments relate to a photodetector arrangement.

BACKGROUND

A germanium-on silicon (Ge-on-Si) photodetector is a key building block for optical interconnect and microwave photonics. A high-power and high-speed photodetector is particularly important for analog optical link with high gain, low noise floor, and high spurious-free dynamic range. However, there is a trade-off between the photodetector operation bandwidth and its saturation power. In general, a photodetector with high speed is usually designed with a low capacitance and a small carrier transit time, thus resulting in small dimensions. This causes the saturation power to be low due to the space charge effect. For conventional photodetectors, it is difficult to work at high speed with a high saturation power. Currently, a Ge photodetector is usually provided with only ~5 mW saturation power and ~10 GHz bandwidth.

SUMMARY

According to an embodiment, a photodetector arrangement is provided. The photodetector arrangement may include a plurality of germanium-based photodetectors, each germanium-based photodetector configured to receive an optical signal and to generate an electrical signal in response to the received optical signal, and an electrode arrangement arranged to conduct the electrical signals.

BRIEF DESCRIPTION OF THE DRAWINGS

In the drawings, like reference characters generally refer to like parts throughout the different views. The drawings are not necessarily to scale, emphasis instead generally being placed upon illustrating the principles of the invention. In the following description, various embodiments of the invention are described with reference to the following drawings, in which.

DETAILED DESCRIPTION

Figure 1:
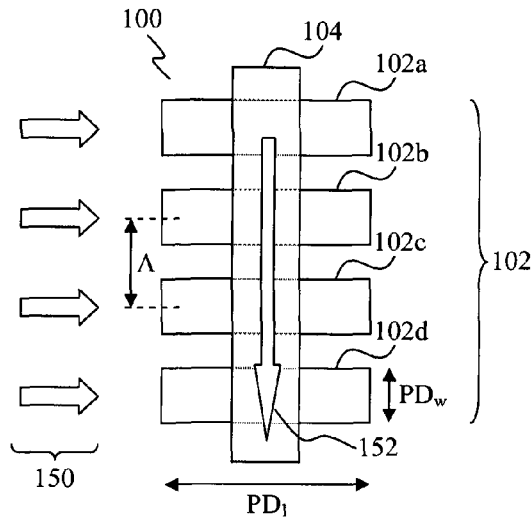
FIG. 1 shows a schematic top view of a photodetector arrangement, according to various embodiments.

The following detailed description refers to the accompanying drawings that show, by way of illustration, specific details and embodiments in which the invention may be practiced. These embodiments are described in sufficient detail to enable those skilled in the art to practice the invention. Other embodiments may be utilized and structural, logical, and electrical changes may be made without departing from the scope of the invention. The various embodiments are not necessarily mutually exclusive, as some embodiments can be combined with one or more other embodiments to form new embodiments.

Embodiments described in the context of one of the devices are analogously valid for the other devices.

Features that are described in the context of an embodiment may correspondingly be applicable to the same or similar features in the other embodiments. Features that are described in the context of an embodiment may correspondingly be applicable to, the other embodiments, even if not explicitly described in these other embodiments. Furthermore, additions and/or combinations and/or alternatives as described for a feature in the context of an embodiment may correspondingly be applicable to the same or similar feature in the other embodiments.

In the context of various embodiments, the articles "a", "an" and "the" as used with regard to a feature or element include a reference to one or more of the features or elements.

In the context of various embodiments, the phrase "at least substantially" may include "exactly" and a reasonable variance.

In the context of various embodiments, the term "about" or "approximately" as applied to a numeric value encompasses the exact value and a reasonable variance.

As used herein, the term "and/or" includes any and all combinations of one or more of the associated listed items.

Various embodiments may relate to fields including silicon (Si) photonics (e.g. Si nano/micro-photonics), microwave photonics, and optical communication systems.

Various embodiments may provide an approach for developing a traveling-wave photodetector array (TWPDA) with large bandwidth and high power handling capability. Various embodiments may also provide an approach for developing a cost effective photodetector for a silicon (Si) integrated circuit.

Various embodiments may provide a large-bandwidth, high-power traveling-wave photodetector array. In other words, various embodiments may provide a traveling-wave electrode photodetector array with a high operation bandwidth and a high power handling capability. The traveling-wave electrode photodetector array may be applicable for optical communication and microwave photonics.

Various embodiments may provide a traveling-wave photodetector array or arrangement (TWPDA) with a large-bandwidth and high power handling capability. Such a TWPDA may be based on a germanium-on-silicon (Ge-on-Si) substrate, which may provide the benefit of large-bandwidth operation. The TWPDA may include multiple cascaded germanium (Ge) photodetectors (PDs) with parallel feeds, which may enhance the power handling capacity of the TWPDA. The photocurrent from each Ge PD may be collected by using an impedance matched traveling-wave electrode (TWE) to maintain the operation bandwidth. The phase difference, for example corresponding to optical signals and/or electrical signals, that may be present in the TWPDA may be compensated by a design of one or more optical waveguide delay lines.

Various embodiments may provide a traveling-wave photodetector (PD) structure or arrangement with double metal layers. A velocity and impedance matched coplanar waveguide (CPW) for a traveling-wave electrode (TWE) may be employed in the photodetector arrangement of various embodiments. In various embodiments, optical waveguide delay lines may be employed in the photodetector arrangement for velocity matching between the optical signal and the electrical signal propagating in the photodetector arrangement.

Various embodiments may provide a simple design of a traveling-wave photodetector (PD) array. Various embodiments may enable a cost effective implementation and CMOS compatible fabrication of the photodetector array or arrangement of various embodiments. Further, the photodetector array of various embodiments may be ready for photonic integration for various applications.

Various embodiments may provide a traveling-wave photodetector array (TWPDA) that may be designed to be velocity and impedance matched, taking into consideration the periodic loading effect from each individual Ge photodetector. Thus, the TWPDA may feature the merits of a large operation bandwidth and a high power handling capability. Such a TWPDA may be potentially usable for microwave photonics, among other possible photonic applications.

FIG. 1 shows a schematic top view of a photodetector arrangement 100, according to various embodiments. The photodetector arrangement 100 includes a plurality of germanium-based photodetectors 102, each germanium-based photodetector 102 configured to receive an optical signal 150 and to generate an electrical signal 152 in response to the received optical signal 150, and an electrode arrangement 104 arranged to conduct the electrical signals 152.

In other words, a photodetector arrangement 100 may be provided. The photodetector arrangement 100 may include an array of photodetectors (PDs) 102, where each PD 102 may include a germanium (Ge)-based material. For illustration purposes, four germanium-based photodetectors (Ge PDs) are shown in FIG. 2, including a first Ge PD 102a, a second Ge PD 102b, a third Ge PD 102c and a fourth Ge PD 102d. However, it should be appreciated that the photodetector arrangement 100 may include two, three, four, five or any higher number of Ge photodetectors 102. Each Ge PD 102a, 102b, 102c, 102d may receive an optical signal (e.g. light) 150 at its input and consequently may produce an electrical signal (e.g. a photocurrent) 152 at its output. The germanium (Ge)-based material of each Ge PD 102a, 102b, 102c, 102d may act as an optical or light absorbing portion. The photodetector arrangement 100 may further include an electrode arrangement 104 for conducting the electrical signals 152 generated by the plurality of Ge PDs 102. This may mean that the electrode arrangement 104 may be electrically coupled to each Ge PD 102a, 102b, 102c, 102d, where the electrode arrangement 104 may be adapted to propagate the electrical signals 152, or in other words, the electrical signals 152 may travel or flow through the electrode arrangement 104. Further, this may mean that the plurality of Ge PDs 102 may be electrically coupled to each other by means of the electrode arrangement 104. The electrical signal 152 from each Ge PD 102a, 102b, 102c, 102d may be combined by the electrode arrangement 104 into a single output.

In the context of various embodiments, each germanium-based photodetector 102a, 102b, 102c, 102d may receive the same optical signal 150.

In various embodiments, the electrode arrangement 104 may include a traveling-wave electrode (TWE) arrangement. This may mean that the photodetector arrangement 100 may be a traveling-wave photodetector array or arrangement (TWPDA). The traveling-wave electrode (TWE) arrangement may act as a transmission line for the electrical signals 152.

The traveling-wave electrode arrangement may include a coplanar waveguide (CPW). The coplanar waveguide may include three electrodes, in the form of a signal (S) electrode and two ground (G) electrodes arranged adjacent to the signal electrode. The two ground electrodes may be arranged on opposite sides of the signal electrode and spaced apart from the signal electrode. The signal electrode and the two ground electrodes may be located on a same plane, and hence coplanar. This may mean that the signal electrode and the two ground electrodes may be arranged on a same side, for example with reference to a substrate. In various embodiments, the signal (S) electrode and the two ground (G) electrodes may be arranged at least substantially parallel to each other.

In various embodiments, the coplanar waveguide may include a signal (S) electrode electrically coupled to the plurality of germanium-based photodetectors 102 to conduct the electrical signals 152, and two ground (G) electrodes arranged on opposite sides of the signal (S) electrode and spaced apart from the signal (S) electrode. The signal electrode may conduct the respective electrical signals 152 generated by the plurality of germanium-based photodetectors 102. The signal electrode may be electrically coupled to the light absorbing portion of each germanium-based photodetector 102a, 102b, 102c, 102d. The two ground electrodes may be electrically coupled to respective contact regions of each germanium-based photodetector 102a, 102b, 102c, 102d. In various embodiments, the plurality of germanium-based photodetectors 102 may be arranged successively or sequentially along a length of the signal electrode.

In the context of various embodiments, the signal electrode may have a width, w, of between about 2 μm and about 20 μm, for example between about 2 μm and about 10 μm, between about 2 μm and about 5 μm, between about 5 μm and about 20 μm, between about 10 μm and about 20 μm, or between about 5 μm and about 10 μm.

In the context of various embodiments, a spacing, g, between the signal electrode and each of the two ground electrodes may be between about 1 µm and about 200 µm, for example between about 1 µm and about 100 µm, between about 1 µm and about 50 µm, between about 100 µm and about 200 µm, or between about 50 µm and about 100 µm.

In the context of various embodiments, the electrode arrangement 104 may include a first conductive layer defined into a plurality of contacts, a respective contact being electrically coupled to a respective germanium-based photodetector 102a, 102b, 102c, 102d of the plurality of germanium-based photodetectors 102 and electrically isolated from the other contacts of the plurality of contacts, and a second conductive layer electrically coupled to the plurality of contacts. A respective contact may collect an electrical signal 152 from an associated germanium-based photodetector 102a, 102b, 102c, 102d. The second conductive layer may form a common contact or electrode to the plurality of contacts, and therefore also to the plurality of germanium-based photodetectors 102. The second conductive layer may be arranged over the first conductive layer.

In various embodiments, the first conductive layer and the second conductive layer may define a traveling-wave electrode arrangement, for example in the form of a coplanar waveguide (CPW). The second conductive layer may be defined into a signal (S) electrode and two ground (G) electrodes, the signal electrode being electrically coupled to the plurality of contacts defined from the first conductive layer, while the two ground electrodes may be electrically coupled to respective contact regions of each germanium-based photodetector 102a, 102b, 102c, 102d.

Each of the first conductive layer and the second conductive layer may be a metal layer. Each of the first conductive layer and the second conductive layer may include a metal including but not limited to aluminum (Al), or copper (Cu). However, it should be appreciated that other metals may be used.

In various embodiments, the photodetector arrangement 100 may further include a plurality of waveguides, wherein a respective waveguide of the plurality of waveguides may be arranged to propagate the optical signal 150 towards or to a respective germanium-based photodetector 102a, 102b, 102c, 102d of the plurality of germanium-based photodetectors 102. A respective waveguide may be optically coupled to a respective germanium-based photodetector 102a, 102b, 102c, 102d. A respective germanium-based photodetector 102a, 102b, 102c, 102d may be formed on or over a respective waveguide. Therefore, the photodetector arrangement 100 may include waveguide-based Ge photodetectors. The plurality of waveguides may be on-chip waveguides, e.g. integrated in the photodetector arrangement 100.

In the context of various embodiments, each waveguide may include silicon (Si). Therefore, the photodetector arrangement 100 may include waveguide-based Ge-on-Si photodetectors.

In various embodiments, a difference in lengths of respective waveguides corresponding to adjacent germanium-based photodetectors of the plurality of germanium-based photodetectors 102 may introduce an optical time delay (or propagation delay) between the adjacent germanium-based photodetectors such that the respective electrical signals 152 generated by the adjacent germanium-based photodetectors are at least substantially in phase (or phase-matched). Therefore, each waveguide may act as an optical delay line for the optical signal 150. In this way, the optical signal delay between the adjacent germanium-based photodetectors may be at least substantially matched to an electrical signal delay between the adjacent germanium-based photodetectors. Therefore, a velocity matched electrode arrangement 104 may be provided.

In various embodiments, respective optical time delays between respective adjacent germanium-based photodetectors may be at least substantially the same.

In various embodiments, the electrode arrangement 104 may be arranged to conduct the electrical signals 152 in a direction at least substantially perpendicular to a direction of propagation of the optical signal 150 through the respective waveguide.

In the context of various embodiments, an impedance, Z, of the electrode arrangement 104 may be at least substantially matched to at least one electrical parameter of each germanium-based photodetector 102a, 102b, 102c, 102d. In this way, the loading effect of each germanium-based photodetector 102a, 102b, 102c, 102d may be taken into consideration for forming an impedance matched electrode arrangement 104. The at least one electrical parameter may include a resistance, $R_s$, and/or a capacitance, $C_p$, of the germanium-based photodetector 102a, 102b, 102c, 102d. Each germanium-based photodetector 102a, 102b, 102c, 102d may have at least substantially similar resistance and/or capacitance.

In the context of various embodiments, the plurality of germanium-based photodetectors 102 may be arranged one after another (e.g. in series or in cascade) in a direction along the conduction of the electrical signals 152 through the electrode arrangement 104. This may mean that the plurality of germanium-based photodetectors 102 may be arranged along a length of the electrode arrangement 104.

In the context of various embodiments, respective electrical signals 152 generated by respective germanium-based photodetectors 102a, 102b, 102c, 102d of the plurality of germanium-based photodetectors 102 may be at least substantially in phase.

In the context of various embodiments, each germanium-based photodetector 102a, 102b, 102c, 102d may be arranged to receive the optical signal 150 in parallel relative to the other germanium-based photodetectors 102a, 102b, 102c, 102d. This may mean that the plurality of germanium-based photodetectors 102 may be arranged with parallel feeds of the optical signal 150 to each germanium-based photodetector 102a, 102b, 102c, 102d.

In the context of various embodiments, the plurality of germanium-based photodetectors 102 may be arranged spaced apart from each other. A period or centre-to-centre spacing, Λ, between adjacent germanium-based photodetectors of the plurality of germanium-based photodetectors 102 may be between about a few tens of microns and about a few hundreds of microns, for example between about 20 µm and about 900 µm, between about 20 µm and about 500 µm, between about 20 µm and about 100 µm, between about 50 µm and about 100 µm, between about 500 µm and about 900 µm, or between about 100 µm and about 500 µm.

In the context of various embodiments, each germanium-based photodetector 102a, 102b, 102c, 102d may have a length, $PD_l$, of between about a few microns and about a few hundreds of microns, for example between about 5 µm and about 500 µm, between about 5 µm and about 300 µm, between about 5 µm and about 100 µm, between about 50 µm and about 100 µm, between about 100 µm and about 500 µm, or between about 100 µm and about 300 µm.

In the context of various embodiments, each germanium-based photodetector 102a, 102b, 102c, 102d may have a width, $PD_w$, of between about a few microns and about a few tens of microns, for example between about 2 µm and about 50 µm, between about 2 µm and about 30 µm, between about 2 µm and about 10 µm, between about 5 µm and about 10 µm, between about 10 µm and about 30 µm, or between about 10 µm and about 50 µm.

In the context of various embodiments, the photodetector arrangement 100 may further include a substrate, wherein the plurality of germanium-based photodetectors 102 may be formed on the substrate. The substrate may include silicon (Si), e.g. a silicon wafer or a silicon-on-insulator (SOI) wafer. Therefore, a Ge-on-Si photodetector arrangement 100 may be provided.

Various embodiments may provide a photodetector arrangement, e.g. a traveling-wave photodetector array (TWPDA). The traveling-wave photodetector array may include an array of high-speed Ge photodetectors. Multiple-channel optical signal or light may be separately input into each high-speed photodetector. Each high-speed photodetector may generate an electrical signal or photocurrent in response to the received light. The generated photocurrent from each of the photodetector may be collected by a traveling-wave electrode (TWE). The traveling-wave electrode may be designed with an impedance match by considering the periodic loading of the photodetectors. Waveguide delay lines may be adopted for velocity matching between the optical and the electrical signals. Further, the photodetector array may be designed with two metal layers in order to provide an easy design and layout for the traveling-wave electrode.

Figure 2A:
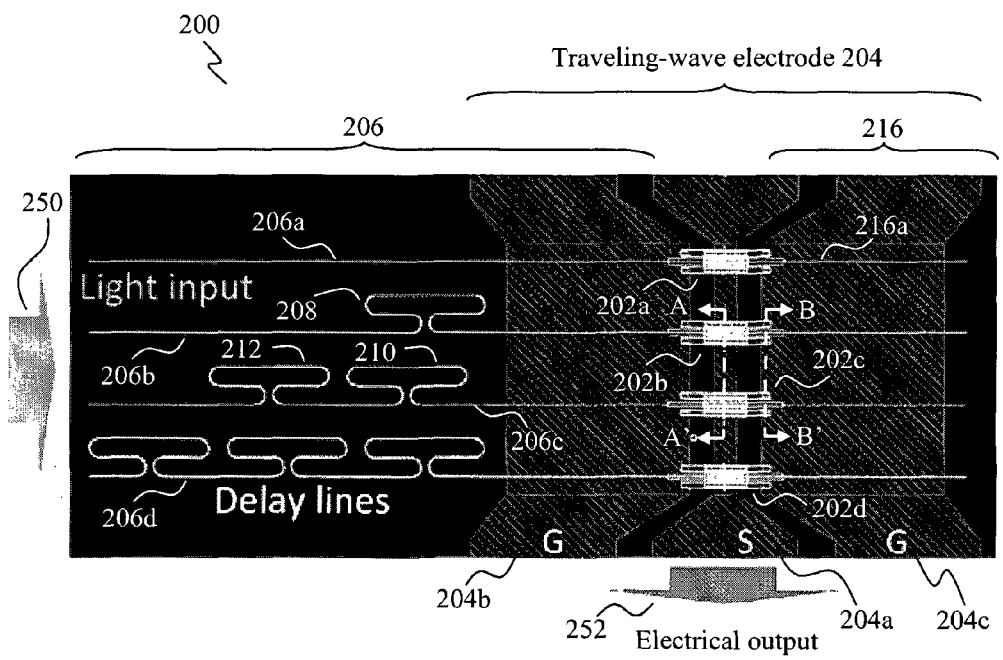
FIG. 2A shows a schematic design layout of a photodetector arrangement, according to various embodiments.

FIG. 2A shows a schematic design layout of a photodetector arrangement 200, according to various embodiments. The photodetector arrangement 200 may be a traveling-wave photodetector array (TWPDA).

The photodetector arrangement 200 may include an array of germanium-based photodetectors or Ge PDs. As a non-limiting example, as shown in FIG. 2A, the photodetector arrangement 200 may include four Ge PDs, for example a first Ge PD 202a, a second Ge PD 202b, a third Ge PD 202c and a fourth Ge PD 202d. The first Ge PD 202a, the second Ge PD 202b, the third Ge PD 202c and the fourth Ge PD 202d may be arranged spaced apart relative to each other. Adjacent Ge PDs may be arranged with a periodicity of A. Each of the first Ge PD 202a, the second Ge PD 202b, the third Ge PD 202c and the fourth Ge PD 202d may be at least substantially similar, for example in terms of structure and/or dimension(s) and/or material(s).

The photodetector arrangement 200 may further include an array of input waveguides 206 respectively optically coupled to the plurality of Ge PDs for conveying or guiding an optical signal (e.g. light), as represented by the arrow 250, to the respective Ge PDs. For example, a first input waveguide 206a may be optically coupled to the first Ge PD 202a, a second input waveguide 206b may be optically coupled to the second Ge PD 202b, a third input waveguide 206c may be optically coupled to the third Ge PD 202c, while a fourth input waveguide 206d may be optically coupled to the fourth Ge PD 202d.

Adjacent input waveguides, e.g. 206a and 206b, may have different lengths. As shown in FIG. 2A, a loop 208 may be introduced in the second input waveguide 206b, thereby introducing a delay line length, and consequently a time delay, as compared to the first input waveguide 206a. In this way, the optical signal 250 propagating through the second input waveguide 206b may arrive at the second Ge PD 202b at a delayed or later time (e.g. by a time difference, $t_{diff}$) as compared to the optical signal 250 arriving at the first Ge PD 202a via the first input waveguide 206a. Further, two loops 210, 212 may be introduced as delay line lengths in, the third input waveguide 206c. Each of the loops 210, 212 may have a length that is at least substantially similar to the length of the loop 208. Therefore, the time difference for the arrival of the optical signal 250 at the third Ge PD 202c as compared to the second Ge PD 202b may be $t_{diff}$, while the time difference for the arrival of the optical signal 250 at the third Ge PD 202c as compared to the first Ge PD 202a may be $2t_{diff}$. Accordingly, the plurality of input waveguides 206 may be waveguide delay lines, acting as optical delay lines. In this way, a respective time delay for the propagation of the optical signal 250 to the respective Ge PDs 202a, 202b, 202c, 202d may be introduced for successive Ge PDs 202a, 202b, 202c, 202d. The plurality of waveguide delay lines 206 may provide identical delay incremental between successive adjacent input waveguides, e.g. between 206a and 206b, between 206b and 206c and between 206c and 206d.

The photodetector arrangement 200 may further include a plurality of output waveguides 216 respectively optically coupled to the plurality of Ge PDs for outputting at least a portion of the optical signal 250. For example, a first output waveguide 216a may be optically coupled to the first Ge PD 202a.

The photodetector arrangement 200 may further include a coplanar waveguide (CPW) as a traveling-wave electrode 204. The traveling-wave electrode 204 may be electrically coupled to the plurality of Ge PDs. The traveling-wave electrode 204, in the form of the CPW, may include a source (S) electrode 204a and a pair of ground (G) electrodes (e.g. a first ground (G) electrode 204b and a second ground (G) electrode 204c). The first ground (G) electrode 204b and the second ground (G) electrode 204c may be arranged on opposite sides of the source (S) electrode 204a. Each of the first ground (G) electrode 204b and the second ground (G) electrode 204c may be arranged spaced apart from the source (S) electrode 204a. This may mean that the first ground (G) electrode 204b and the second ground (G) electrode 204c may be physically separated and electrically isolated from the source (S) electrode 204a.

As the optical signal 250 is received or detected by the respective Ge PDs 202a, 202b, 202c, 202d, in response, each Ge PD 202a, 202b, 202c, 202d may generate an electrical signal (e.g. a current, e.g. a photocurrent), as represented by the arrow 252, which may be conducted via the source (S) electrode 204a. Each of the first ground (G) electrode 204b and the second ground (G) electrode 204c may act as a common return path for an electrical current (e.g. the electrical signal 252) in the CPW 204. The electrical signal 252 may provide an indication of a parameter (e.g. intensity) associated with the optical signal 250. In various embodiments, a circuit (not shown) may be provided to receive the electrical signal 252. Such a circuit may be provided internally as part of the photodetector arrangement 200. The electrical signal 252 may be processed by means of the circuit.

As a result of the time delay associated with the arrival of the optical signal 250 at adjacent Ge PDs, there is a corresponding time delay in the generation of the respective electrical signals 252 by the adjacent Ge PDs. For example, there may be a time delay in the generation of the electrical signal 252 by the second Ge PD 202b so as to compensate for the time required for the propagation or conduction of the electrical signal 252 generated by the first Ge PD 202a from the first Ge PD 202a to the second Ge PD 202b. In this way, there may be a velocity matching between the optical 250 and the electrical 252 signals. As a result, respective electrical signals 252 generated by the Ge PDs 202a, 202b, 202c, 202d may be at least substantially in phase.

In various embodiments, the traveling-wave electrode 204 may be designed with an impedance match by considering the periodic loading of the photodetectors (PDs) 202a, 202b, 202c, 202d. With optimization, each of the Ge PDs 202a, 202b, 202c, 202d may operate with a bandwidth that may be larger than approximately 10 GHz. With the traveling-wave electrode design, the operation bandwidth of such TWPDA or photodetector arrangement 200 may maintain the operation bandwidth as that of each individual Ge PD 202a, 202b, 202c, 202d.

In order to compensate for the phase difference between each PD 202a, 202b, 202c, 202d induced by the traveling-wave electrode 204, the respective waveguide delay lines 206a, 206b, 206c, 206d for each input channel may be suitably designed and optimized.

Figure 2B:
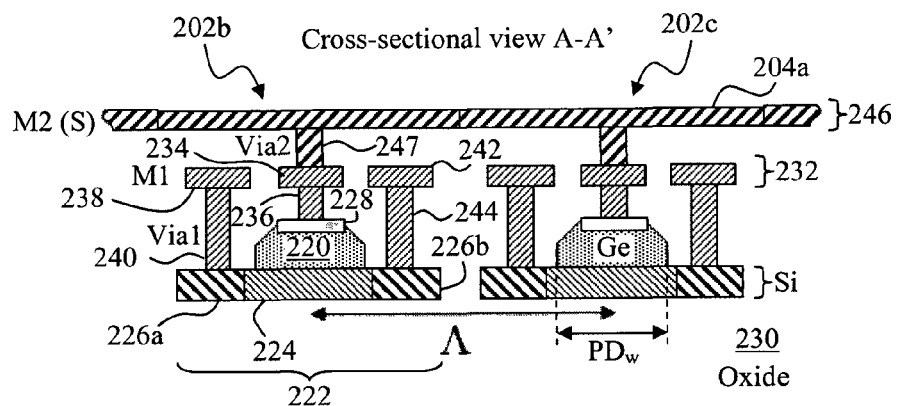
FIG. 2B shows a schematic cross-sectional view of the photodetector arrangement of the embodiment of FIG. 2A, taken long the line A-A'.
Figure 2C:
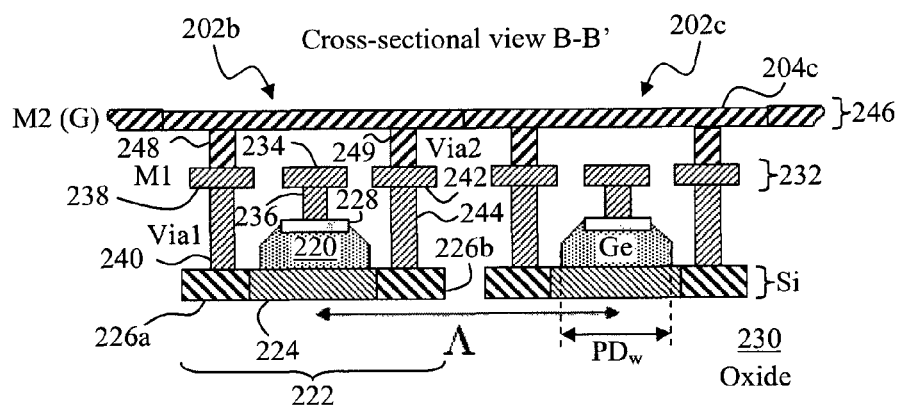
FIG. 2C shows a schematic cross-sectional view of the photodetector arrangement of the embodiment of FIG. 2A, taken long the line B-B'.

FIGS. 2B and 2C show schematic cross-sectional views of the photodetector arrangement 200, illustrating the TWPDA design, taken long the lines A-A' and B-B' respectively indicated in FIG. 2A. As shown in FIGS. 2B and 2C, the second Ge PD 202b and the third Ge PD 202c may be arranged at a spacing or period indicated as Λ. Each of the second Ge PD 202b and the third Ge PD 202c may have a width, $PD_w$, as illustrated in FIGS. 2B and 2C, and a length, $PD_l$. FIGS. 2B and 2C illustrate cross-sectional views of a design of the photodetector arrangement 200 with two metal layers 232, 246 which will be described later below. In order to provide for an easy layout and impedance matching of the traveling-wave electrode 204, the CPW, as the traveling-wave electrode 204, may be arranged in a direction orthogonal to the input waveguides 206a, 206b, 206c, 206d, and two metal layers 232, 246 may be introduced.

Using the second Ge PD 202b as an example, although similar descriptions may apply to the other Ge PDs of the photodetector arrangement 200, the second Ge PD 202b may include a germanium (Ge) material portion 220 on a silicon (Si) substrate 222. The germanium (Ge) material portion 220 may be a light absorbing portion for absorbing at least a portion of the optical signal or light 250. Thus, the second Ge PD 202b may be constructed using a Ge-on-Si platform. The silicon (Si) substrate 222 may include a core region 224, and a first contact region 226a and a second contact region 226b arranged on opposite sides of the core region 224. The core region 224 may be a lightly doped region (e.g. a P+ doped region), while each of the first contact region 226a and the second contact region 226b may be a heavily doped region (e.g. a P++ doped region). The core region 224 may be optically coupled to the second input waveguide 206b. A contact portion 228 may be provided electrically coupled to the Ge material portion 220. The contact portion 228 may be a heavily doped portion (e.g. an N++ doped portion) of a conductivity type that is opposite to that of the substrate 222. In various embodiments, the plurality of Ge PDs, including the second Ge PD 202b and the third Ge PD 202c, may be embedded in an insulating layer (e.g. an oxide layer, e.g. SiO$_2$) 230. The insulating layer 230 may be a buried oxide (BOX).

A first metal (M) layer 232 may be provided electrically coupled to the plurality of Ge PDs, including the second Ge PD 202b and the third Ge PD 202c, of the photodetector arrangement 200, for example by means of a plurality of conductive vias (e.g. Vias1). The first metal layer 232 may be defined into a plurality of contacts 234, where a respective contact 234 may be electrically coupled to a respective Ge material portion 220, by means of a respective via 236. Each contact 234 may be electrically isolated from each other.

The first metal (M) layer 232 may be further defined into a plurality of first contacts 238, where a respective first contact 238 may be electrically coupled to a respective first contact region 226a, by means of a respective via 240. The first metal (M) layer 232 may be further defined into a plurality of second contacts 242, where a respective second contact 242 may be electrically coupled to a respective second contact region 226b, by means of a respective via 244. The plurality of contacts 234, first contacts 238 and second contacts 242 may be electrically isolated from each other.

A second metal (M2) layer 246 may be provided electrically coupled to the plurality of contacts 234, the plurality of first contacts 238 and the plurality of second contacts 242, for example by means of a plurality of conductive vias (e.g. Vias2). The second metal layer 246 may be defined into the source (S) electrode 204a, the first ground (G) electrode 204b and the second ground (G) electrode 204c. As shown in FIG. 2B, the source (S) electrode 204a may be electrically coupled to the plurality of contacts 234, by means of respective vias 247 to respective contacts 234. As shown in FIG. 2C, the second ground (G) electrode 204c may be electrically coupled to the plurality of first contacts 238, by means of respective vias 248 to respective first contacts 238, and electrically coupled to the plurality of second contacts 242, by means of respective vias 249 to respective second contacts 242. It should be appreciated that the arrangement and electrical coupling related to the first ground (G) electrode 204b may be analogously based on the descriptions relating to the second ground (G) electrode 204c.

As compared to prior art, various embodiments may provide at least one of the following: (1) a velocity and impedance matched traveling-wave electrode design that may allow high-speed operation. Impedance matching may be designed by considering the periodic PD loading effect, while velocity matching may be designed by introducing optical waveguide delay lines; (2) a double metal layer design which may ease the design and layout of the traveling-wave electrode.

Figure 3A:
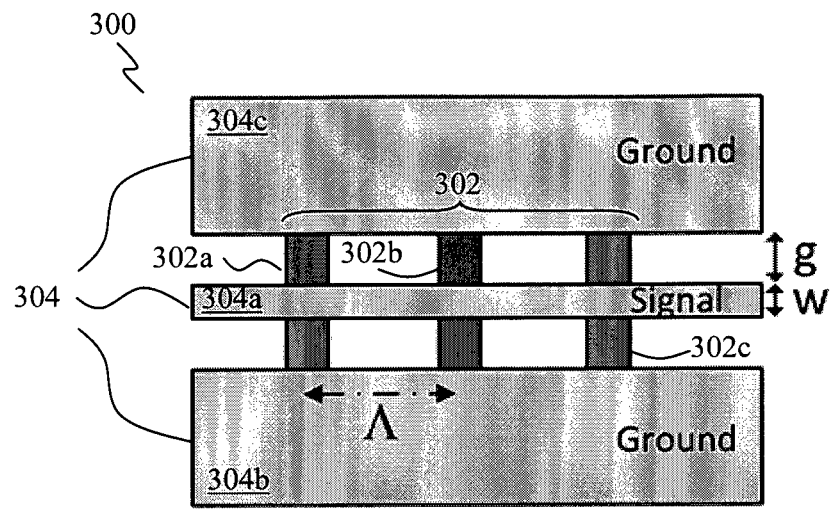
FIG. 3A shows a simplified schematic top view of a photodetector arrangement, according to various embodiments.

A design of the velocity and impedance matched traveling-wave electrode will now be described by way of the following non-limiting example. FIG. 3A shows a simplified schematic top view of a photodetector arrangement 300, according to various embodiments, illustrating a traveling-wave photodetector array (TWPDA) having a photodetector (PD) array 302 and a traveling-wave electrode (TWE) 304. For illustration purposes, as a non-limiting example as shown in FIG. 3A, the photodetector (PD) array 302 may include three germanium photodetectors (Ge PDs), for example a first Ge PD 302a, a second Ge PD 302b, and a third Ge PD 302c. The first Ge PD 302a, the second Ge PD 302b, and the third Ge PD 302c may be arranged spaced apart from each other with a periodicity of Λ. This means that adjacent Ge PDs may have a centre-to-centre spacing defined by Λ. Each of the first Ge PD 302a, the second Ge PD 302b, and the third Ge PD 302c may have a width, $PD_w$, and a length, $PD_l$.

The traveling-wave electrode (TWE) 304 may be in the form of a coplanar waveguide (CPW) having a source (S) electrode 304a, and a first ground (G) electrode 304b and a second ground (G) electrode 304c arranged on opposite sides of the source (S) electrode 304a. Each of the first ground (G) electrode 304b and the second ground (G) electrode 304c may be arranged spaced apart from the source (S) electrode 304a, by a distance, g. The source (S) electrode 304a may have a width, w. Each of the source (S) electrode 304a, the first ground (G) electrode 304b and the second ground (G) electrode 304c may be formed of a metal layer.

Figure 3B:
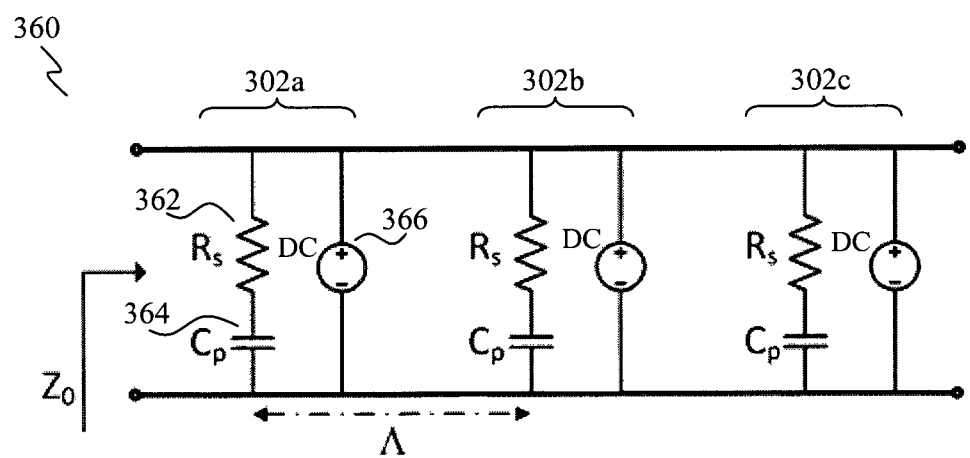
FIG. 3B shows an equivalent circuit of the photodetector arrangement of the embodiment of FIG. 3A.

FIG. 3B shows an equivalent circuit 360 of the photodetector arrangement 300, taking into consideration the loading effect of the individual PD 302a, 302b, 302c, with parasitic resistor and capacitor. Using the first Ge PD 302a as an example, each Ge PD may include a parasitic resistor, $R_s$, 362 and a parasitic capacitance, $C_p$, 364 coupled in series, and a DC (direct-current) source 366 coupled in parallel to $R_s$ 362 and $C_p$ 364.

The dispersion characteristic of the photodetector arrangement 300 may be modelled using the equivalent circuit 360. Without considering the loading effect of the Ge PDs 302a, 302b, 302c, the effective dielectric constant, $\varepsilon_{eff}$, of the CPW 304 may be expressed by Equation 1:

$$\varepsilon_{eff} = \left[\sqrt{\varepsilon_r} + \frac{\sqrt{\varepsilon_r} - \sqrt{\varepsilon_t}}{1 + \alpha(f/f_{cutoff})^{-b}}\right]^2, \quad \text{(Equation 1)}$$

where $\varepsilon_r$ is the dielectric constant of a substrate (e.g. a silicon (Si) substrate), $\varepsilon_t$ is the effective dielectric constant of the CPW 304, taking into consideration the metal thickness, f is frequency, $f_{cutoff}$ is the cutoff frequency of the lowest TE mode propagating through the CPW 304, and $\alpha$ and b are constants depending on the configurations and dimensions of the CPW 304.

The phase velocity, $v_{ph}$, of the CPW 304 without the loading effect may thus be expressed as Equation 2 below:

$$v_{ph} = \frac{c}{\sqrt{\varepsilon_{eff}}}, \quad \text{(Equation 2)}$$

where c is the light speed in vacuum.

The impedance, $Z_o$, of the CPW 304 may be calculated as $$Z_o = \frac{K'(k)}{K(k)} \frac{1}{2(\varepsilon_r + 1)\varepsilon_0 v_{ph}}, \quad \text{(Equation 3)}$$

where K(k) and K'(k) are the complete elliptical integrals of the first kind and $\varepsilon_o$ is the vacuum permittivity, which equals to 8.8541878176×10$^{-12}$ F/m.

When considering the loading effect with the resistor $R_s$ 362 and the capacitor $C_p$ 364 of a PD 302a, 302b, 302c, the phase velocity, $v_L$, and the impedance, $Z_L$, of the CPW 304 may be expressed as $$v_L = \frac{1}{\sqrt{C_M(f) + \frac{C_{p,eq}}{\Lambda}}} \frac{1}{\sqrt{L_M(f)}}, \quad \text{(Equation 4)}$$

$$Z_L = \frac{\sqrt{L_M(f)}}{\sqrt{C_M(f) + \frac{C_{p,eq}}{\Lambda}}}, \quad \text{(Equation 5)}$$

where the parameters $C_M$, $L_M$ are the equivalent capacitance and inductance per unit length of the CPW 304, $C_{p,eq}$ is the effective capacitance of the photodetector (PD) 302a, 302b, 302c related to $R_s$ 362 and $C_p$ 364, and $\Lambda$ refers to the period between adjacent PDs (e.g. between PDs 302a and 302b, or between PDs 302b and 302c).

The parameter $C_M$ may be expressed as:

$$C_M(f) = \varepsilon_0 \varepsilon_{eff} \frac{K'(k)}{K(k)}. \quad \text{(Equation 6)}$$

The effective capacitance, $C_{p,eq}$, may be expressed as:

$$\frac{1}{C_{p,eq}} = \frac{1}{C_p} + j\omega R_s. \quad \text{(Equation 7)}$$

Based on the above described numerical model, the phase velocity and the impedance of the CPW or TWE 304 may be calculated and compared, depending on the structure parameters, including the RF (radio frequency) frequency, the CPW dimensions, the photodetector (PD) dimensions, and the periodicity.

Figure 4:
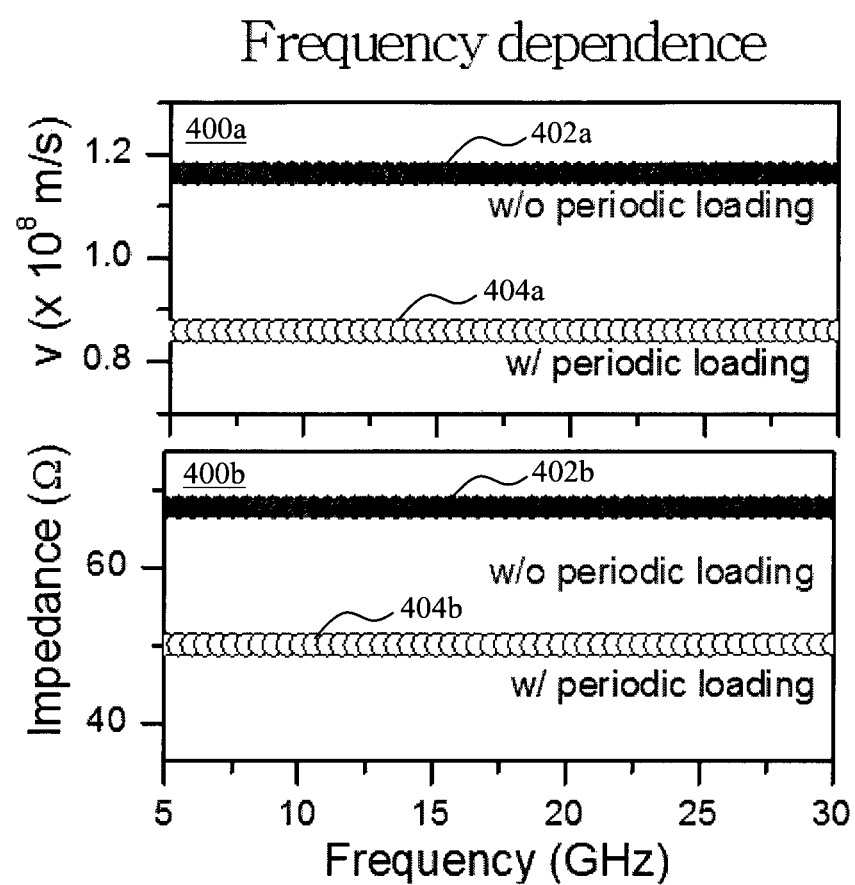
FIG. 4 shows plots of modelling results of the traveling-wave electrode (TWE) phase velocity and impedance as a function of radio frequency (RF) frequency.

FIG. 4 shows plots 400a, 400b of modelling results of the traveling-wave electrode (TWE) phase velocity, v, and impedance as a function of radio frequency (RF) frequency, f. The modelled results 402a, 402b correspond to a standalone CPW, without the photodetector loading effect, while the modelled results 404a, 404b correspond to a CPW with the photodetector loading effect.

Figure 5:
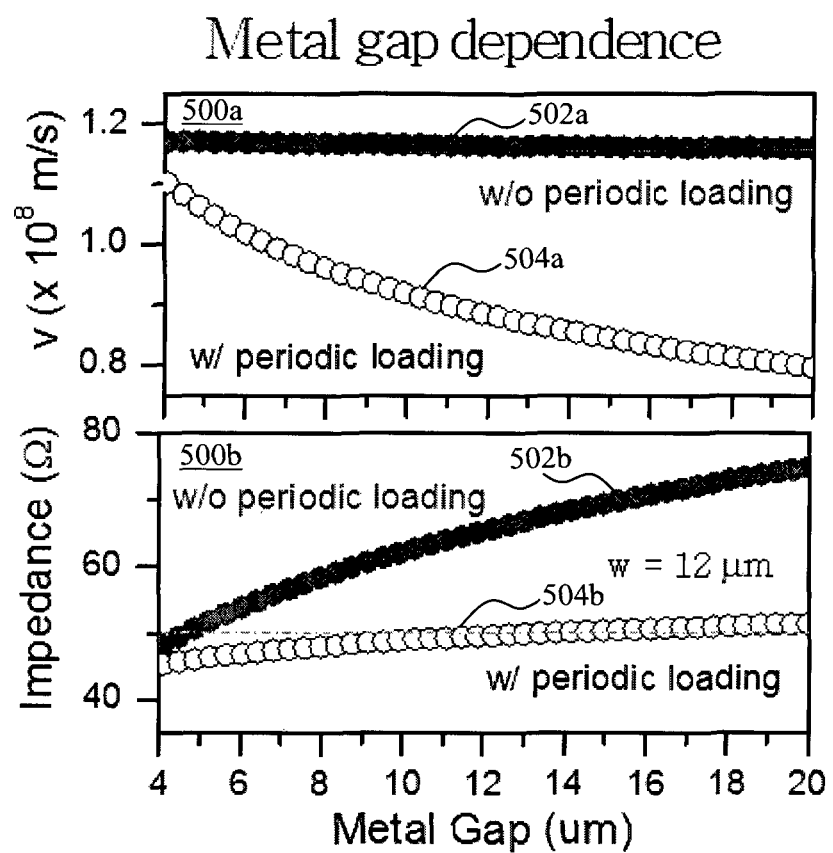
FIG. 5 shows plots of modelling results of the traveling-wave electrode (TWE) phase velocity and impedance as a function of metal gap.

FIG. 5 shows plots 500a, 500b of modelling results of the traveling-wave electrode (TWE) phase velocity, v, and impedance as a function of metal gap. The term "metal gap" refers to the spacing, g, between a source (S) electrode and a ground (G) electrode of the TWE. The modelled results 502a, 502b correspond to a standalone CPW, without the photodetector loading effect, while the modelled results 504a, 504b correspond to a CPW with the photodetector loading effect. The modelled results 502b, 504b for the impedance are obtained for a source electrode width, w, of about 12 μm.

Figure 6:
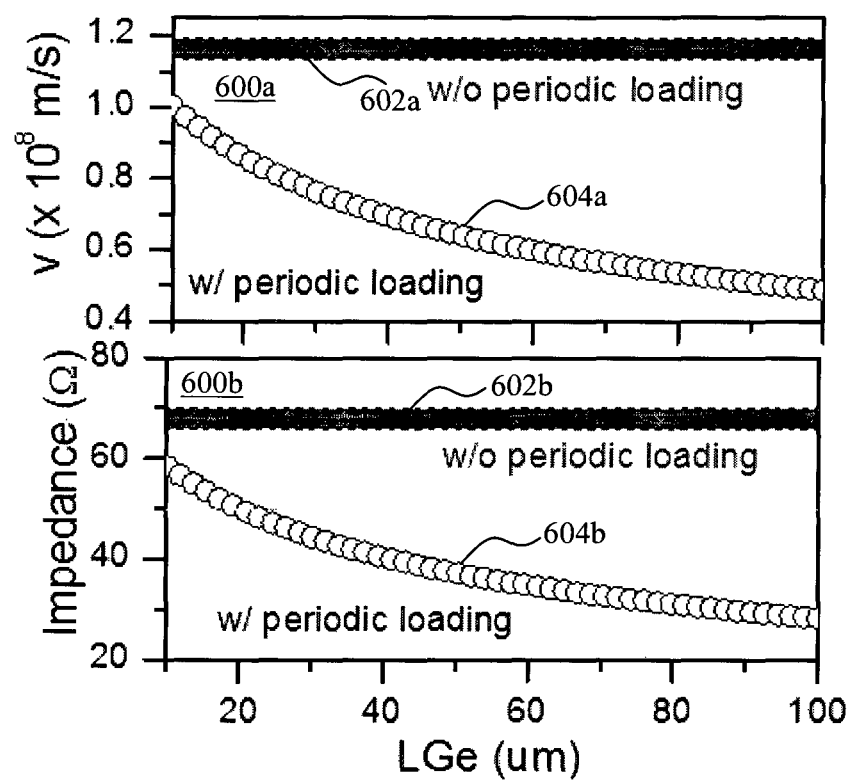
FIG. 6 shows plots of modelling results of the traveling-wave electrode (TWE) phase velocity and impedance as a function of photodetector length.

FIG. 6 shows plots 600a, 600b of modelling results of the traveling-wave electrode (TWE) phase velocity, v, and impedance as a function of photodetector length. The modelled results 602a, 602b correspond to a standalone CPW, without the photodetector loading effect, while the modelled results 604a, 604b correspond to a CPW with the photodetector loading effect.

Figure 7:
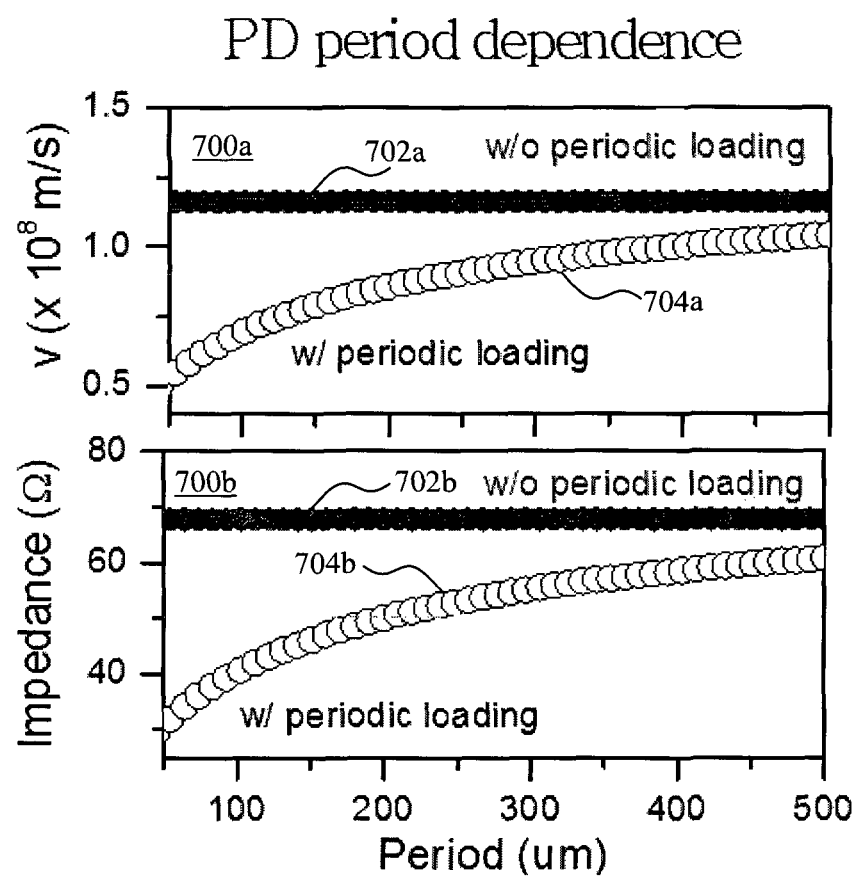
FIG. 7 shows plots of modelling results of the traveling-wave electrode (TWE) phase velocity and impedance as a function of the periodicity of the photodetectors.

FIG. 7 shows plots 700a, 700b of modelling results of the traveling-wave electrode (TWE) phase velocity, v, and impedance as a function of the periodicity, $\Lambda$, of the photodetectors. The modelled results 702a, 702b correspond to a standalone CPW, without the photodetector loading effect, while the modelled results 704a, 704b correspond to a CPW with the photodetector loading effect.

As may be observed in FIGS. 4 to 7, the photodetector loading effect may induce significant deviations or modifications from the standalone CPW. Referring to FIGS. 4 and 5, there may be a small variation of both velocity and impedance with the RF frequency, while there may be a large variation as a function of the CPW metal gap, for example when the loading effect is present. Referring to FIGS. 6 and 7, both the Ge PD length and the period, $\Lambda$, may affect the velocity and impedance significantly for a CPW with a loading effect.

As both the phase velocity and the impedance may be dependent on the design parameters, the TWPDA may be carefully designed and optimised. For example, the velocity and impedance matched traveling PD array may be designed taking into consideration one or more parameters such as the Ge photodetector width, the Ge photodetector length, the period between adjacent Ge photodetetcors and the CPW width and gap.

Based on the loading periodicity, Λ, and the phase velocity, v, the time difference between the respective photocurrents generated from adjacent photodetectors may be calculated, and subsequently, the respective optical delay lines in each input channel may be determined in order to compensate for the time difference. Thus, the photocurrent that reaches the output point from each individual PD may have identical phases and thus may be phase matched.

Demonstration of a photodetector arrangement or TWPDA on a silicon chip will now be described. A designed TWPDA was fabricated using a CMOS-compatible fabrication process on an 8" silicon-on-insulator (SOI) wafer. The TWPDA may be designed with velocity matching between the optical and the electrical signals. The TWPDA may be designed with impedance matching in terms of the traveling-wave electrode.

Figure 8A:
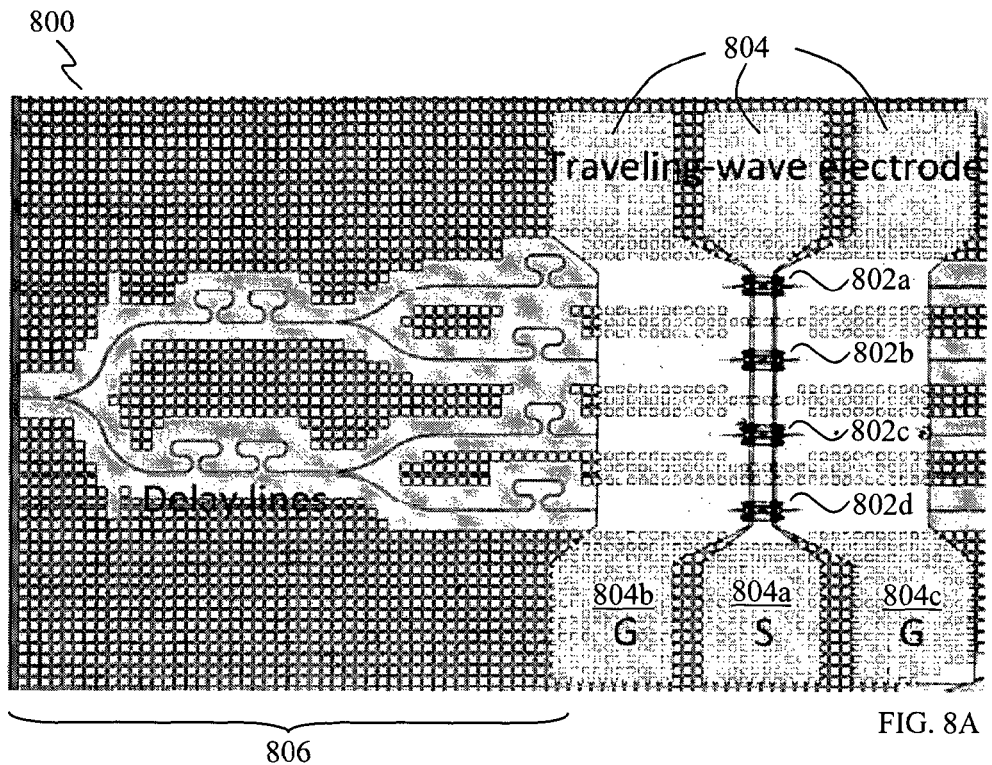
FIG. 8A shows an optical microscope image of a fabricated 4-channel photodetector arrangement, according to various embodiments.
Figure 8B:
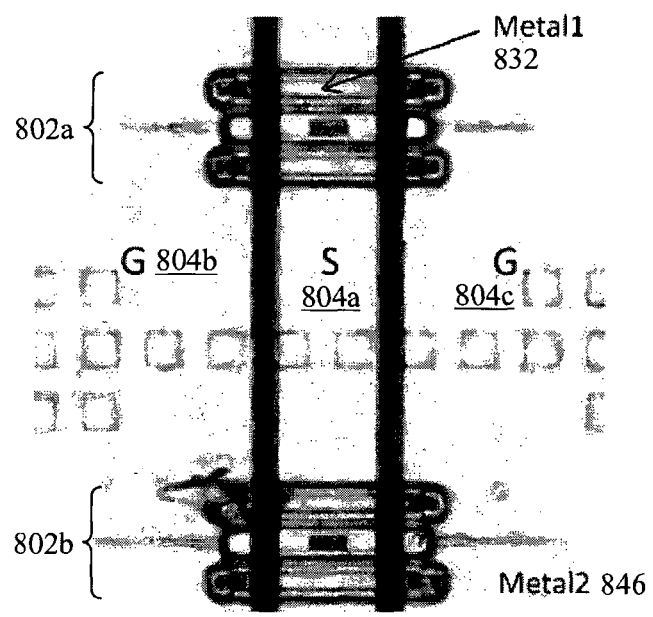
FIG. 8B shows an optical microscope image of an enlarged sectional view of the fabricated 4-channel photodetector arrangement of the embodiment of FIG. 8A.

FIG. 8A shows an optical microscope image of a fabricated 4-channel photodetector arrangement (4-channel TWPDA) 800, while FIG. 8B shows an optical microscope image of an enlarged sectional view of the fabricated 4-channel photodetector arrangement 800. The 4-channel photodetector arrangement 800 includes four high-speed Ge PDs 802a, 802b, 802c, 802d, two metal layers 832, 846, an impedance-matched traveling-wave electrode 804 having a source (S) electrode 804a, a first ground (G) electrode 804b and a second ground (G) electrode 804c, and balanced optical delay lines 806. In such a design, the gap spacing and the strip line width corresponding to the traveling-wave electrode 804 may be designed freely, avoiding any layout problem.

Figure 9:
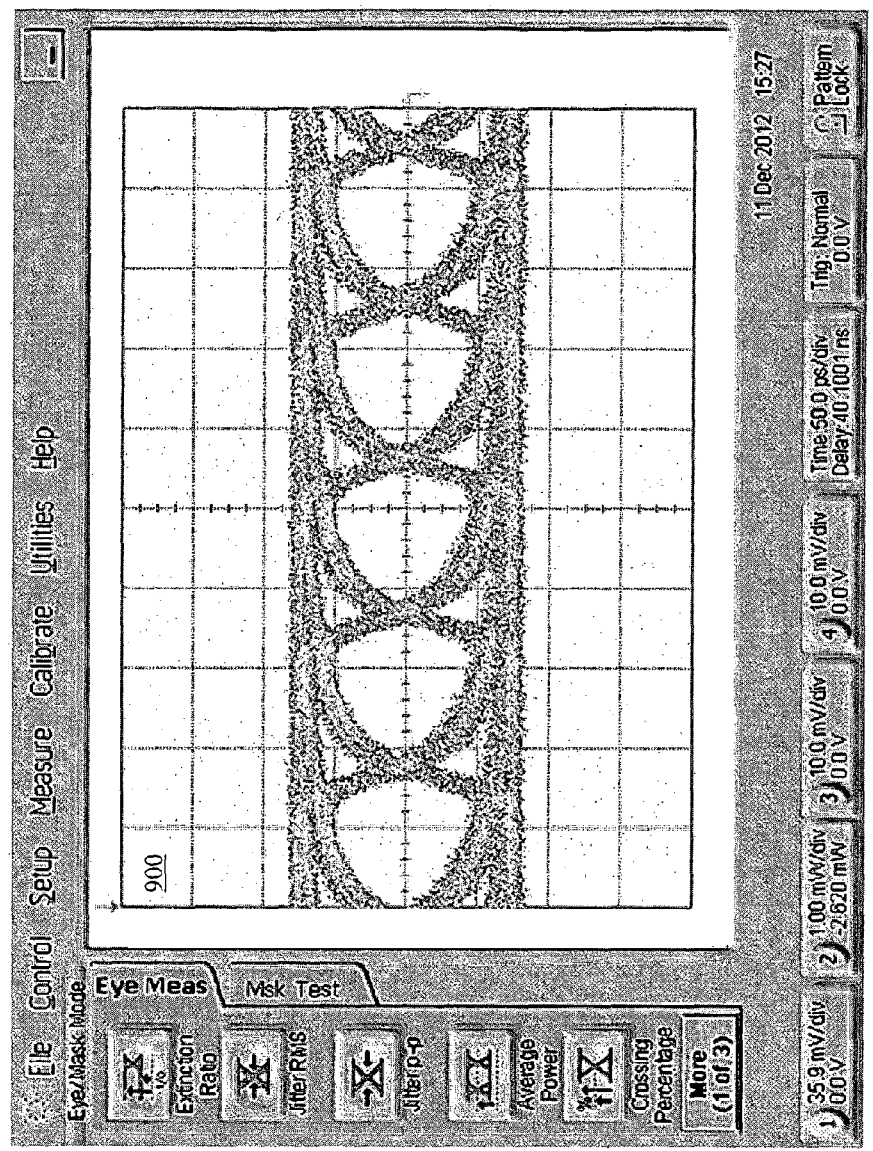
FIG. 9 shows a plot of results of 10 Gb/s pseudo-random binary sequence (PRBS) data detection using the 4-channel photodetector arrangement of the embodiment of FIG. 8A.

FIG. 9 shows a plot 900 of results of 10 Gb/s pseudo-random binary sequence (PRBS) data detection using the 4-channel photodetector arrangement 800, illustrating the high-quality detection of the 10 Gb/s PRBS data. Approximately 1 ps electrical unit delay was measured for the travelling-wave electrode 804.

As described above, the photodetector arrangement of various embodiments may include a cascade of N high-speed Ge photodetectors, which may be electrically connected by a coplanar waveguide (CPW) as a traveling-wave electrode arrangement. The traveling-wave electrode may be provided with velocity and impedance matchings. Two metal layers may be used in order to provide an easy design for the impedance matched traveling-wave electrode. Waveguide-based optical delay lines may be adopted for velocity matching between the optical and the electrical signals.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

The invention claimed is:

1. A photodetector arrangement comprising:
   a plurality of germanium-based photodetectors, each germanium-based photodetector configured to receive an optical signal and to generate an electrical signal in response to the received optical signal; and
   an electrode arrangement arranged to conduct the electrical signals;
   wherein the electrode arrangement comprises a traveling-wave electrode arrangement.

2. The photodetector arrangement as claimed in claim 1, wherein the traveling-wave electrode arrangement comprises a coplanar waveguide.

3. The photodetector arrangement as claimed in claim 2, wherein the coplanar waveguide comprises:
   a signal electrode electrically coupled to the plurality of germanium-based photodetectors to conduct the electrical signals; and
   two ground electrodes arranged on opposite sides of the signal electrode and spaced apart from the signal electrode.

4. The photodetector arrangement as claimed in claim 3, wherein the signal electrode has a width of between about 2 µm and about 20 µm.

5. The photodetector arrangement as claimed in claim 3, wherein a spacing between the signal electrode and each of the two ground electrodes is between about 1 µm and about 200 µm.

6. The photodetector arrangement as claimed in claim 1, wherein the electrode arrangement comprises:
   a first conductive layer defined into a plurality of contacts, a respective contact being electrically coupled to a respective germanium-based photodetector of the plurality of germanium-based photodetectors and electrically isolated from the other contacts; and
   a second conductive layer electrically coupled to the plurality of contacts.

7. The photodetector arrangement as claimed in claim 1, further comprising:
   a plurality of waveguides, wherein a respective waveguide of the plurality of waveguides is arranged to propagate the optical signal towards a respective germanium-based photodetector of the plurality of germanium-based photodetectors.

8. The photodetector arrangement as claimed in claim 7, wherein each waveguide comprises silicon.

9. The photodetector arrangement as claimed in claim 7, wherein a difference in lengths of respective waveguides corresponding to adjacent germanium-based photodetectors of the plurality of germanium-based photodetectors introduces an optical time delay between the adjacent germanium-based photodetectors such that the respective electrical signals generated by the adjacent germanium-based photodetectors are at least substantially in phase.

10. The photodetector arrangement as claimed in claim 7, wherein the electrode arrangement is arranged to conduct the electrical signals in a direction at least substantially perpendicular to a direction of propagation of the optical signal through the respective waveguide.

11. The photodetector arrangement as claimed in claim 1, wherein an impedance of the electrode arrangement is at least substantially matched to at least one electrical parameter of each germanium-based photodetector.

12. The photodetector arrangement as claimed in claim 1, wherein the plurality of germanium-based photodetectors are arranged one after another in a direction along the conduction of the electrical signals through the electrode arrangement.

13. The photodetector arrangement as claimed in claim 1, wherein respective electrical signals generated by respective germanium-based photodetectors of the plurality of germanium-based photodetectors are at least substantially in phase.

14. The photodetector arrangement as claimed in claim 1, wherein each germanium-based photodetector is arranged to receive the optical signal in parallel relative to the other germanium-based photodetectors.

15. The photodetector arrangement as claimed in claim 1, wherein the plurality of germanium-based photodetectors are arranged spaced apart from each other.

16. The photodetector arrangement as claimed in claim 15, wherein a period between adjacent germanium-based photodetectors of the plurality of germanium-based photodetectors is between about 20 μm and about 900 μm.

17. The photodetector arrangement as claimed in claim 1, wherein each germanium-based photodetector has a length of between about 5 μm and about 500 μm.

18. The photodetector arrangement as claimed in claim 1, wherein each germanium-based photodetector has a width of between about 2 μm and about 50 μm.

19. The photodetector arrangement as claimed in claim 1, further comprising a substrate, wherein the plurality of germanium-based photodetectors are formed on the substrate.

* * * * *